(12) United States Patent
Wu

(10) Patent No.: US 7,424,664 B2
(45) Date of Patent: Sep. 9, 2008

(54) DUPLICATE DETECTION CIRCUIT FOR RECEIVER

(75) Inventor: Mau-Lin Wu, Hsin-Chu (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 578 days.

(21) Appl. No.: 11/163,398

(22) Filed: Oct. 17, 2005

(65) Prior Publication Data

US 2007/0089041 A1    Apr. 19, 2007

(51) Int. Cl.
*H03M 13/00* (2006.01)

(52) U.S. Cl. ...................... 714/776; 714/758
(58) Field of Classification Search .............. 714/758, 714/776
See application file for complete search history.

(56) References Cited

U.S. PATENT DOCUMENTS

| | | | | |
|---|---|---|---|---|
| 5,574,979 A | * | 11/1996 | West | 455/63.1 |
| 5,844,918 A | * | 12/1998 | Kato | 714/751 |
| 6,609,226 B1 | * | 8/2003 | Figueira | 714/807 |
| 6,665,278 B2 | * | 12/2003 | Grayson | 370/328 |
| 7,353,446 B2 | * | 4/2008 | Gorshe | 714/758 |
| 2003/0081603 A1 | * | 5/2003 | Rune | 370/390 |
| 2003/0123389 A1 | * | 7/2003 | Russell et al. | 370/230 |

* cited by examiner

*Primary Examiner*—Mujtaba K Chaudry
(74) *Attorney, Agent, or Firm*—Winston Hsu

(57) ABSTRACT

A duplicate detection circuit for a receiver includes a CRC generator for generating a CRC value of frame header information, and a control circuit coupled to the CRC generator. The control circuit has a first output, a second output, and a control input. When the control input is not set, the control circuit outputs the CRC value at the first output. When the control input is set, the control circuit outputs the CRC value at the second output. A buffer has an input coupled to the first output of the control circuit. A compare circuit has an input coupled to an output of the buffer and another input coupled to the second output of the control circuit. The compare circuit compares a CRC value at the second output of the control circuit with a CRC value stored in the buffer, and outputs a duplicate indication when detecting a match.

5 Claims, 5 Drawing Sheets

DUPLICATE DETECTION CIRCUIT FOR RECEIVER

BACKGROUND OF THE INVENTION

1. Field of the Invention

The present invention relates to digital electronics, and more specifically, to data recovery schemes.

2. Description of the Prior Art

In data communications systems reliability of data transfer is very important. To this end, a typically used data recovery scheme is acknowledgement (ACK) of received data.

Referring to FIG. 1, assume that a data frame is to be transmitted from a first device 102 to a second device 104 in a prior art communications system 100. After the first device 102 transmits the data frame to the second device 104, the first device 102 waits for a reply from the second device 104. This reply includes an ACK frame and signifies that the data frame has been received correctly. During this waiting period, the first device 102 checks for a timeout. If the first device 102 detects a timeout, meaning that the ACK frame was likely not sent, the first device 102 will retry the transmission of the data frame and again wait for an ACK frame. This procedure is repeated until a retry limit is reached in which case the first device 102 gives up transmission of the data frame.

In this data recovery scheme, there is one situation that should be detected by the receiver, the second device 104. When the second device 104 correctly receives the data frame and properly replies with the ACK frame, there is a chance that the first device 102 does not receive the ACK frame. This can result from changes in medium (i.e. air) conditions, interference from other communications systems especially those that incapable of avoiding transmission collisions, channel interference from two pairs of devices sharing the same communications channel, or other phenomena. As mentioned, if the first device 102 does not receive the ACK frame, the first device 102 will retransmit the data frame and await another ACK frame. This is a duplicate transmission since the receiver device 104 has already correctly received the data frame yet confirmation of this has not been made. Thus, for efficiency, the receiver device 104 should perform duplicate detection of some sort so that the duplicate data frame can be ignored and a proper ACK frame can be sent out in response. Conventionally, duplicate detection is achieved in the receiver device 104 by a hardware or software procedure that records a transmitting device ID and transmission sequence number of received data frames and checks if a retry bit is set. If the retry bit is set, the procedure then compares the device ID and sequence number to those of a previously received frame, and if a match is determined, a duplicate frame is said to be detected.

When duplicate detection is implemented by software, duplicate frames exist in the lower-level hardware. Duplicate frames are not dropped until after comparison by a CPU at a relatively high level. This means that direct memory access (DMA) and CPU bandwidth are wasted, which has an overall effect on system performance and data throughput. In ultra-wideband (UWB) applications DMA and CPU bandwidth are quite limited due to a 480 Mbps throughput requirement. In modern systems, such as UWB where there may be several streams of different types (e.g. DRP and PCA), and thus a multitude of frames to undergo duplicate detection, the software approach becomes unwieldy.

Duplicate detection by hardware, on the other hand, is costly in storage elements required for storing the information to be compared (i.e. device ID and sequence number; or source ID, delivery ID, and sequence control in UWB).

SUMMARY OF THE INVENTION

It is therefore a primary objective of the invention to provide a duplicate detection circuit that minimizes hardware requirements.

Briefly summarized, the invention includes a cyclic redundancy check (CRC) generator having an input for receiving frame header information, the CRC generator for generating a CRC value of the frame header information, and a control circuit having an input coupled to an output of the CRC generator, the control circuit having a first output, a second output, and a control input. When the control input is not set, the control circuit outputs the CRC value at the first output. When the control input is set, the control circuit outputs the CRC value at the second output. The invention includes a buffer having an input coupled to the first output of the control circuit, the buffer for storing at least a CRC value, and a compare circuit having an input coupled to an output of the buffer and another input coupled to the second output of the control circuit. The compare circuit is for comparing a CRC value output at the second output of the control circuit with at least a CRC value stored in the buffer, and outputting a duplicate indication when the compared CRC values match.

These and other objectives of the present invention will no doubt become obvious to those of ordinary skill in the art after reading the following detailed description of the preferred embodiment that is illustrated in the various figures and drawings.

DETAILED DESCRIPTION

The invention is described in terms of a ultra-wideband (UWB) media access control (MAC) implementation, however, this exemplary application should not limit the possible uses of the invention. According to the invention, CRC values of header information are compared for duplicate detection.

Figure 1:
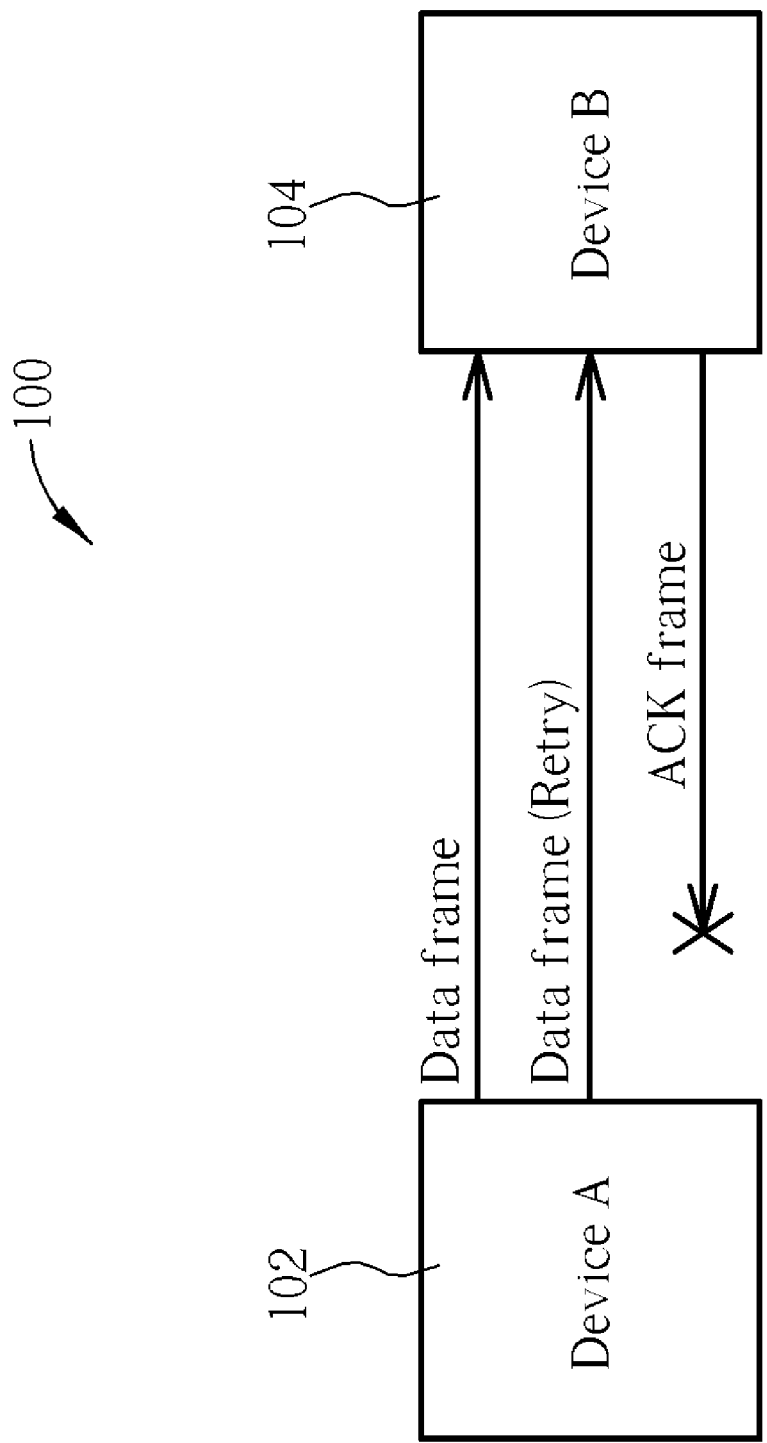
FIG. 1 is a schematic diagram of a conventional communications system.
Figure 2:
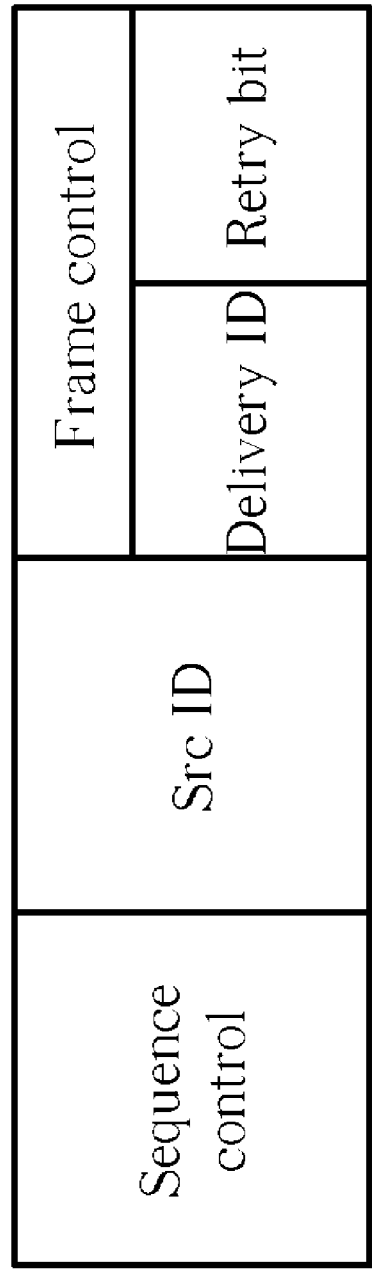
FIG. 2 is a schematic diagram of a frame header according to the invention.

Please refer to FIG. 2, which is a schematic diagram of a frame header 200 comprising frame header information according to the invention. The frame header 200 includes a transmission source identification field, "SrcID", which identifies a device transmitting the frame and which can be 2 bytes (16 bits) long, for example. A control field, "Sequence Control", denotes a sequence index of the frame and can be assigned 14 bits, for instance. Another control field, "Frame Control", has a sub-field "Delivery ID" for identifying a stream to which the frame belongs. The sub-field "Delivery ID" can be 4 bits long. The field "Frame Control" also has a bit, "Retry Bit", indicting whether the frame is a retransmitted one. The frame header 200 is exemplary, and other frame header structures can be used with the invention.

Figure 3:
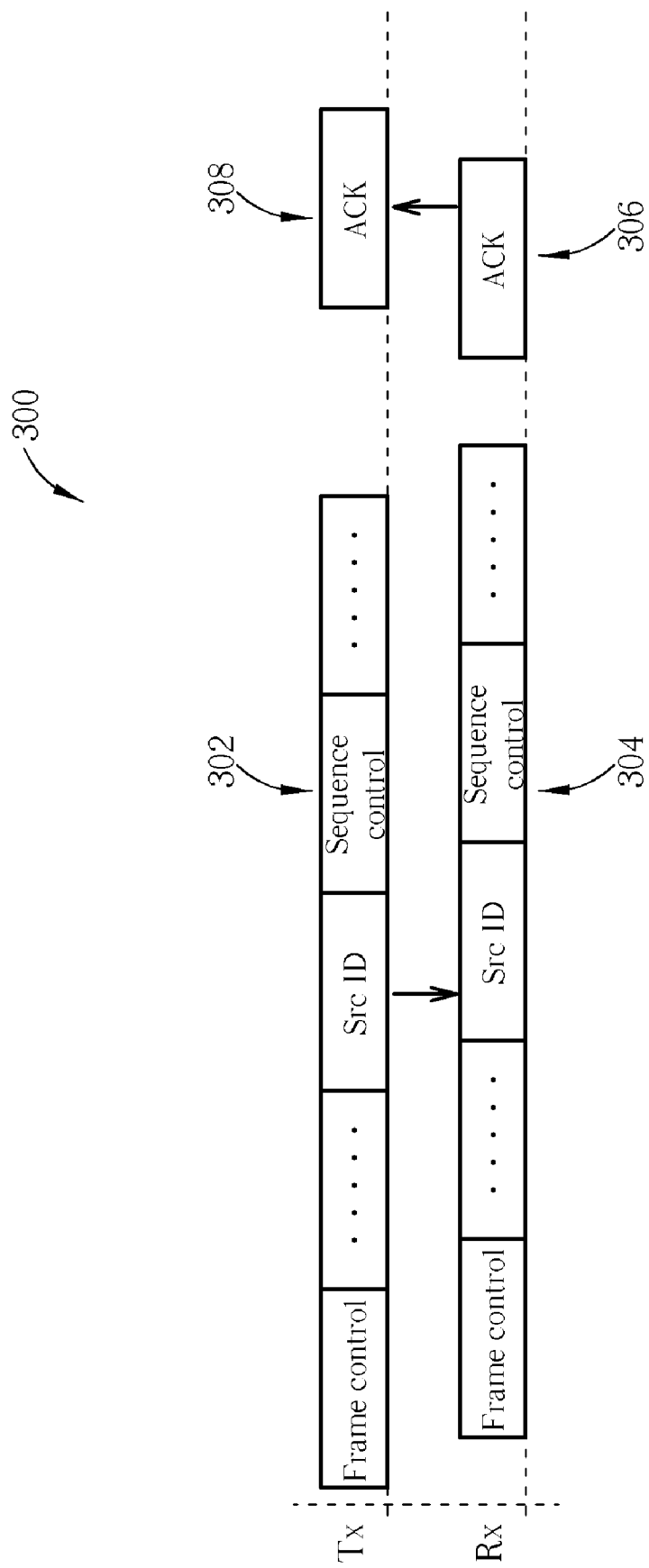
FIG. 3 is a schematic diagram of frame transmission with the header of FIG. 2.

FIG. 3 shows a transmission 300 of data frames. A data frame 302, which includes a frame header having the aforementioned fields "Frame Control", "SrcID", "Sequence Control", is transmitted from a transmitter and received at a receiver as a data frame 304. The received data frame 304 is acknowledged by an acknowledgement (ACK) 306 that is sent to and received by the transmitter as ACK 308. In this way, the header fields are used in communication to identify frame data (not shown).

Figure 4:
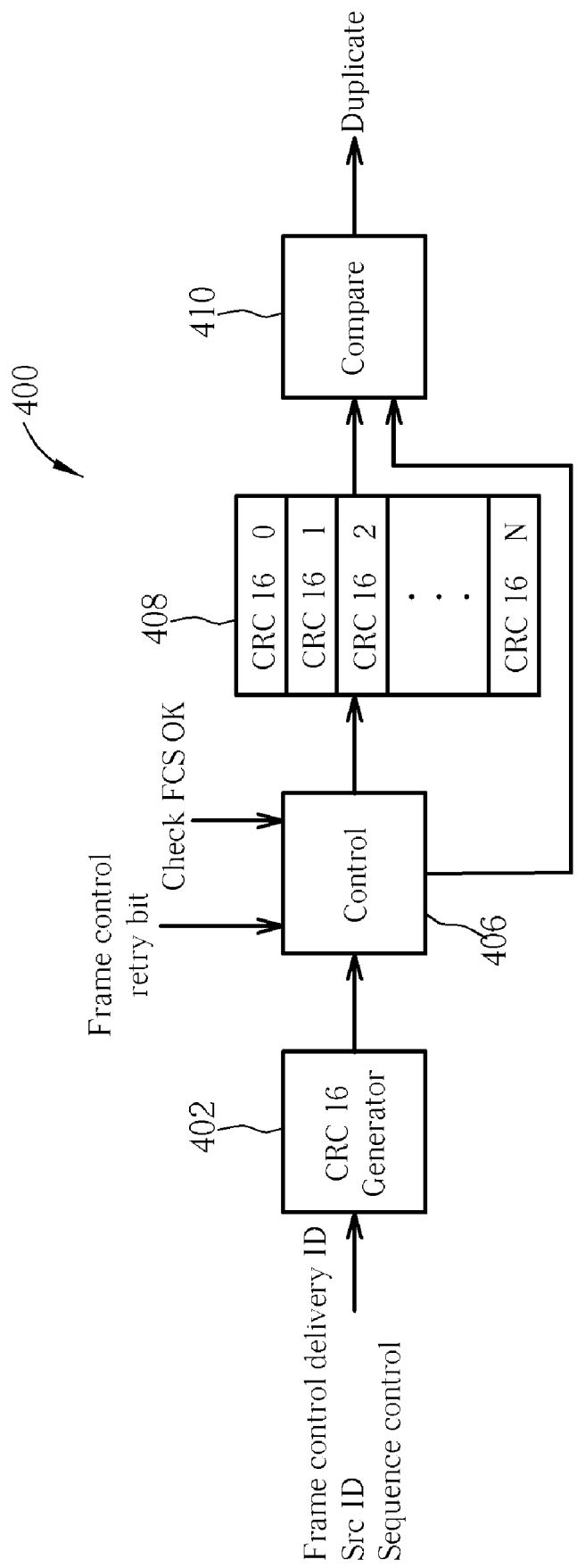
FIG. 4 is a block diagram of duplicate detection circuit according to the invention.

An embodiment of the invention is illustrated in FIG. 4, which is a block diagram of duplicate detection circuit 400. The duplicate detection circuit 400 forms part of the receiver, such as the receiver of FIG. 3 for example, and can be made of well-known hardware components. The specific location of the duplicate detection circuit 400 within a receiver device is not critical, yet the duplicate detection circuit 400 should be located at as low a level as practically possible to avoid the receiver carrying duplicate frames for too long. The duplicate detection circuit 400 comprises a cyclic redundancy check (CRC) generator 402 having an input for receiving frame header information, such as the aforementioned frame header fields "Deliver ID", "SrcID", and "Sequence Control". Connected to the CRC generator 402 is a control circuit 406 having a control input, such as inputs for the "Retry Bit" and a "Check FCS OK" (frame-received bit). A buffer 408 is connected to a first output the control circuit 406, which in turn has an output connected to a compare circuit 410. A second output of the control circuit 406 is connected to the compare circuit 410. The compare circuit 410 can output a duplicate indication that indicates a duplicate frame has been received.

The CRC generator 402 generates a CRC value of the input frame header information, namely, the input frame header fields "Deliver ID", "SrcID", and "Sequence Control". CRC values have low tolerance to error. That is, a one bit change in the input frame header information results in a multi-bit change in the CRC value. This makes the subsequent comparison of CRC values very sensitive. In the embodiment of the invention, because of the expected size of the input frame header information, the CRC generator 402 is preferably a CRC16 generator, meaning that 16-bit CRC values are generated. The actual theory behind generating CRC values is well known in the art and is not repeated here. As frames are received, the CRC generator 402 continually generates corresponding CRC values.

The control circuit 406 serves to conditionally forward the CRC values generated by the CRC generator 402. Since it is not necessary to always perform duplicate detection, the control inputs "Retry Bit" and a "Check FCS OK" can be used. The input "Retry Bit" is provided by the frame control information (see FIG. 2) and indicates that the frame is a retransmission of a previously retransmitted one, and consequently may be a duplicate frame. The "Check FCS OK" is received from other hardware and indicates whether the frame has been correctly received. As can be seen in Table 1, only when the "Retry Bit" and "Check FCS OK" inputs are set will duplicate detection yield meaningful results.

TABLE 1

| Check FCS OK | Retry Bit | Case | Forward CRC value to |
|---|---|---|---|
| 0 | 0/1 | frame not received correctly | n/a |
| 1 | 0 | frame is not a retransmitted frame | buffer 408 |
| 1 | 1 | retransmitted frame that is received correctly | compare circuit 410 |

Table 1 also describes the internal operation of the control circuit 406. Specifically, only when the control inputs "Retry Bit" and "Check FCS OK" are set does the control circuit 406 forward the CRC value to the compare circuit 410. On the other hand, when the frame is received correctly but is not indicated as a retransmission, the control circuit 406 forwards the CRC value to the buffer 408. In the case where the frame is not received correctly, the CRC value need not be forwarded anywhere. The result is that, when the received frame has no chance of being a duplicate, the control circuit 406 sends the CRC value to be stored in the buffer 408 for future comparison; and when the received frame may be a duplicate, the control circuit 406 sends the CRC value to the compare circuit 410.

The buffer 408 is a device that can store data, such as a group of flip-flops or similar devices. The main purpose of the buffer 408 is to store or queue CRC values for future comparison. As shown in FIG. 4, the buffer 408 can queue up to N CRC16 values for comparison. The buffer 408 can be any well-known device that serves this purpose.

The compare circuit 410 compares the CRC values stored in the buffer 408 with the CRC value output by the control circuit 406. If a match is detected, then the compare circuit outputs a duplicate indication. If no match is detected, the compare circuit does not output the duplicate indication. The duplicate indication can be any kind of signal, with the simplest case being a digital "1" to indicate a duplicate. The compare circuit 410 can be realized by a comparator or similar device.

Assuming that the fields "SrcID", "Delivery ID", and "Sequence Control" are required to uniquely identify a frame, then 34 bits (=16+14+4) are required for conventional duplicate detection. If there are a total of N sets of these fields stored for duplicate detection, then this means that the total storage element requirement is 34N bits. However, according to the invention, only 16N bits (for storing CRC values in the buffer 408) plus an overhead of about the equivalent of 16 storage elements for the CRC generator 402 are required. Thus, the storage cost of the invention is about 16N+16 bits versus 34N bits for the prior art, which is a little over half as much.

Figure 5:
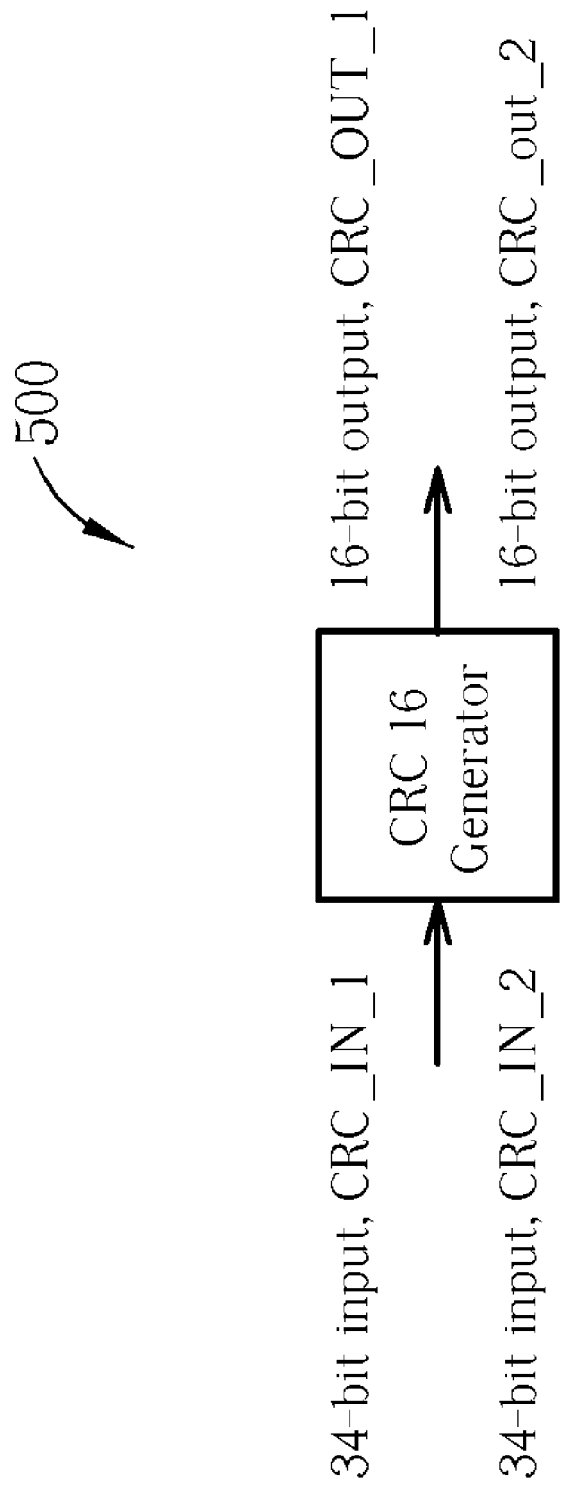
FIG. 5 is a block diagram of a CRC generator.

An appropriate CRC16 generator 500 for this calculation load is shown in FIG. 5. Supplied at the input are 34-bit inputs such as $CRC_{13}IN_{13}$ 1 and $CRC_{13}IN_{13}$ 2, while supplied at the output are 16-bit CRC values such as $CRC_{13}OUT_{13}$ 1 and $CRC_{13}OUT_{13}$ 2. The result is that, according to the control circuit 406, the compare circuit 410 compares CRC values $CRC_{13}OUT_{13}$ 1 and $CRC_{13}OUT_{13}$ 2, which is tolerably equivalent to comparing the actual values $CRC_{13}IN_{13}$ 1 and $CRC_{13}IN_{13}$ 2. However, by comparing CRC values, hardware requirements can be minimized.

In contrast to the prior art, the present invention provides a hardware solution that compares CRC values for duplicate detection. This leads to a nearly 50% reduction in required hardware, improves the FIFO utilization rate in the receiver when compared to the conventional software approach, and reduces demand on DMA and CPU bandwidth.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A duplicate detection circuit for a receiver, comprising:
    a cyclic redundancy check (CRC) generator having an input for receiving frame header information, the CRC generator for generating a CRC value of the frame header information;

a control circuit having an input coupled to an output of the CRC generator, the control circuit having a first output, a second output, and a control input; wherein when the control input is not set, the control circuit outputs the CRC value at the first output; and when the control input is set, the control circuit outputs the CRC value at the second output;

a buffer having an input coupled to the first output of the control circuit, the buffer for storing at least a CRC value; and a compare circuit having an input coupled to an output of the buffer and another input coupled to the second output of the control circuit, the compare circuit for comparing a CRC value output at the second output of the control circuit with at least a CRC value stored in the buffer, and outputting a duplicate indication when the compared CRC values match.

2. The duplicate detection circuit of claim 1, wherein the CRC values are 16-bit CRC values.

3. The duplicate detection circuit of claim 1, wherein the control input of the control circuit comprises a retry bit and frame-received bit; the retry bit indicating that the frame header information is of a frame that has been retransmitted; the frame-received bit indicating that the frame has been correctly received at the receiver.

4. The duplicate detection circuit of claim 3, wherein the control input is set when the retry bit and the frame-received bit are both set, and the control input is not set when the retry bit is not set.

5. The duplicate detection circuit of claim 1, wherein the frame header information comprises a transmission source identification number, a sequence index, and a stream number.

* * * * *